United States Patent [19]

Weber et al.

[11] 3,959,730
[45] May 25, 1976

[54] DIGITAL HYSTERESIS CIRCUIT

[75] Inventors: Charles A. Weber, Marion; Michael W. Lundgreen, Esterville, both of Iowa

[73] Assignee: Rockwell International Corporation, El Segundo, Calif.

[22] Filed: Sept. 16, 1974

[21] Appl. No.: 506,483

[52] U.S. Cl. .............................. 328/63; 307/208; 307/269; 328/155; 343/7.3
[51] Int. Cl.² ..................... H03K 1/17; H03K 19/08
[58] Field of Search .............. 307/208, 269; 328/63, 328/72, 155, 179; 343/7.3

[56] References Cited
UNITED STATES PATENTS

| 3,114,109 | 12/1963 | Melas | 307/208 |
|---|---|---|---|
| 3,188,484 | 6/1965 | Jorgensen | 307/208 |
| 3,225,301 | 12/1965 | McCann | 307/208 |
| 3,270,288 | 8/1966 | Hackett | 307/269 |
| 3,764,920 | 10/1973 | Galcik et al. | 307/208 |
| 3,894,246 | 7/1975 | Torgrim | 307/208 |

Primary Examiner—Stanley D. Miller, Jr.
Attorney, Agent, or Firm—Richard W. Anderson; Robert J. Crawford

[57] ABSTRACT

A digital hysteresis circuit which generates delayed, clock-synchronous output pulses from input pulses having a random timing relationship with the clock. Input pulses slewing generally in or out on a repetitive clock defined time base may back up from the direction they are slewing by a predetermined time interval without changing the time position of the clock-synchronous, time-delayed output pulses which they successively generate. The circuit is useful in reducing jitter in the read-out of a digital counter while the counter is operating by preventing a load command pulse occurring at counter transition time from effecting a read-out at that instant, and further effective in reducing jitter in the commanded read out from a digital counter where system uncertainty might otherwise cause shift of successive input commands from their normally predictable time positions.

8 Claims, 9 Drawing Figures

DIGITAL HYSTERESIS CIRCUIT

This invention relates, generally, to timing pulse generating means and more particularly to a means for establishing a clock-defined synchronism between a clock pulse source and a source of pulses normally asynchronous with a clock source.

More particularly, the present invention relates to a means for establishing a time delay between the occurrence of an output pulse generated in response to a randomly timed input pulse as concerns a system clock, with any output pulse being time-synchronous with the clock and occurring at a delayed clock-synchronous time position, and, further to establish a hysteresis as concerns the time position of the output pulse by permitting input pulses which are slewing generally in or out on a repetitive clock defined time base to back up from the direction they are slewing by a predetermined time interval without changing the time position of the output pulses which they successively cause to be generated.

Numerous digital counting circuitries may use a binary counter to accumulate a binary count corresponding to a time delay interval definitive of a parameter to be measured. In a distance measuring equipment (DME) system, means are commonly employed to cause the count accumulated in a counter to be periodically read out to indicating or other utilization means in response to a load command pulse.

In DME systems, for example, a load command pulse may be caused to be generated in correspondence to the existing center of a system range gate, with the time position of the range gate with respect to an interrogation pulse being an analog of distance in the system.

In these systems, the displayed or otherwise utilized count may exhibit read-out jitter if the count accumulated in the counter is commanded to be transferred to a utilization means at a time corresponding to a counter clock transition.

Additionally, the output may jitter if, due to existing system uncertainties, the load command pulse may, from one time occurrence to a next occurrence thereof, shift from a normally predictable position by an amount corresponding to a discrete portion of a counter clock period, causing the counter read-out to exhibit a jittering indication due to a skip or back-up from that count previously held and read out.

Jitter in the read-out may occur due to the count accumulated in the counter being loaded into an output register for display or utilization purposes when the count is changing due to the counter clock exhibiting a count transition at that moment in time. Further, system uncertainties, which, for a particular system may be defined as a particular portion of a counter clock cycle, may cause successive ones of the load command input pulses to back up, in response to which the accumulated count at the time of the count transfer is less than that previously transferred.

The latter phenomenon exists due to residual noise in ranging systems, where the fundamental operation consists of counting clock pulses falling in the time between interrogation and reply pulses. If for example, in a given system the uncertainty amounted to one-half the system resolution (i.e. one-half the counter clock peeriod), existing ranges occurring close to N times the range resolution could provide an indication variation of one count more or less in a time-varying pattern. For example, if a particular DME system provided 0.1 nautical mile resolution, at a distance of 97.13 miles, the assumed 0.05 nautical mile uncertainty could produce an indication of either 97.0 or 91.1 nautical miles in a pattern determined by the time characteristic of the noise.

Accordingly, a primary object of the present invention is the provision of a digital hysteresis circuitry which receives clock asynchronous load command pulses and produces, in response thereto, a clock period synchronized output load command pulse which does not fall at a counter clock transition period, and which is caused to be time delayed (exhibit a hysteresis) should the load command back up from the direction in which it is slewing to assure that the accumulated account transferred into an output register means in response to the synchronized load command would tend to exist only at the most outbound value, and the system noise uncertainty would not be displayed.

A further object of the present invention is a provision of means for generating, in response to load command pulses asynchronous with respect to a system clock, time delayed output pulses which are generated in a time-synchronous relationship with respect to a system clock cycle.

The present invention is featured in the development of first and second operational pulse trains the pulses of which respectively occupy time positions in like areas of alternate half-cycles of the system clock pulse train, and, by logic gating means responsive to the system clock source, to gate, in response to a nonsynchronous load command input pulse, a single one of the pulses in one of the operational pulse trains, depending upon the time relationship between the nonsynchronous load command input pulse and the operational pulse trains. The gated pulse comprises a clock synchronous load pulse output bearing a time-delayed relationship with respect to the nonsynchronous load command input pulse and successive input pulses slewing in or out on a clock defined time base may back up (up to a predetermined interval) from the slew direction without changing the time position of the load pulse output.

These and other features and objects of the present invention will become apparent upon reading the following description with reference to the accompanying drawings, in which.

Figure 1:
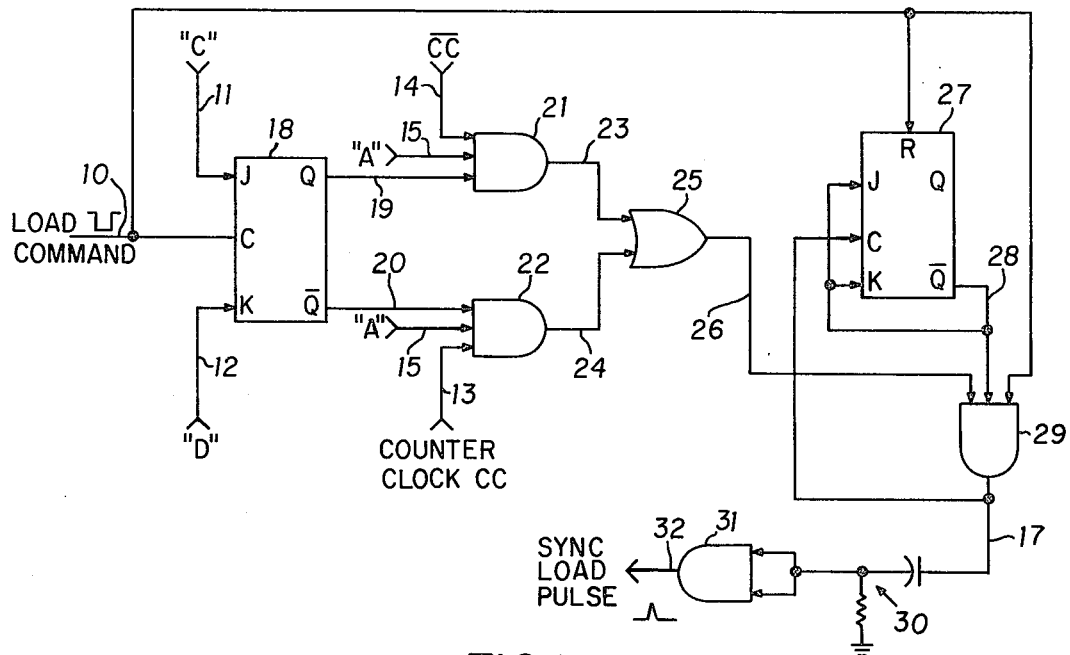
FIG. 1 is a functional diagram of a first embodiment of a digital hysteresis circuit in accordance with the present invention.

With reference to FIG. 1, a first embodiment of a digital hysteresis circuitry in accordance with the present invention is depicted. A load command input pulse 10 (which might correspond to the range gate center pulse in a DME system) is applied as input to the hysteresis circuitry. The load command pulse 10 may bear any timing relationship with respect to a system clock. In accordance with the present invention, a synchronous load pulse output 32 is developed which bears a synchronous relationship with respect to a system clock, which is time delayed with respect to the load command pulse input 10, and which retains a previous time position should a subsequent command pulse back up from the direction in which it is slewing.

The load command input pulse 10 is applied to a logic circuitry comprising J-K flip-flops 18 and 27 and logic gating means under control of operational pulse trains C, D, a counter clock waveform CC, and operational waveform A.

Figure 2:
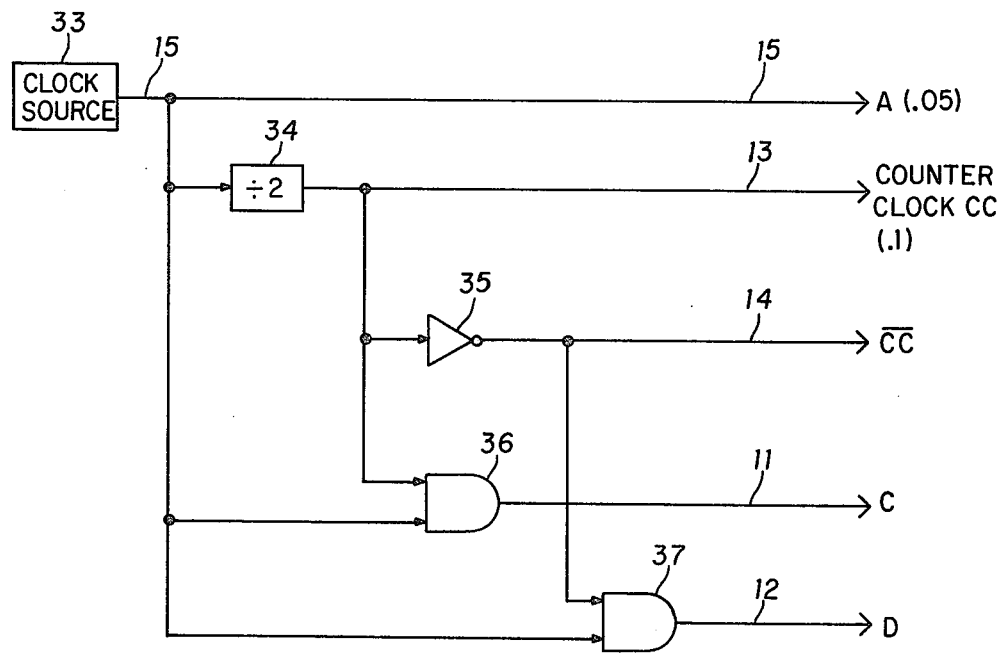
FIG. 2 is a functional diagram of logic means by means of which control pulses utilized in the system of FIG. 1 might be generated.
Figure 3:
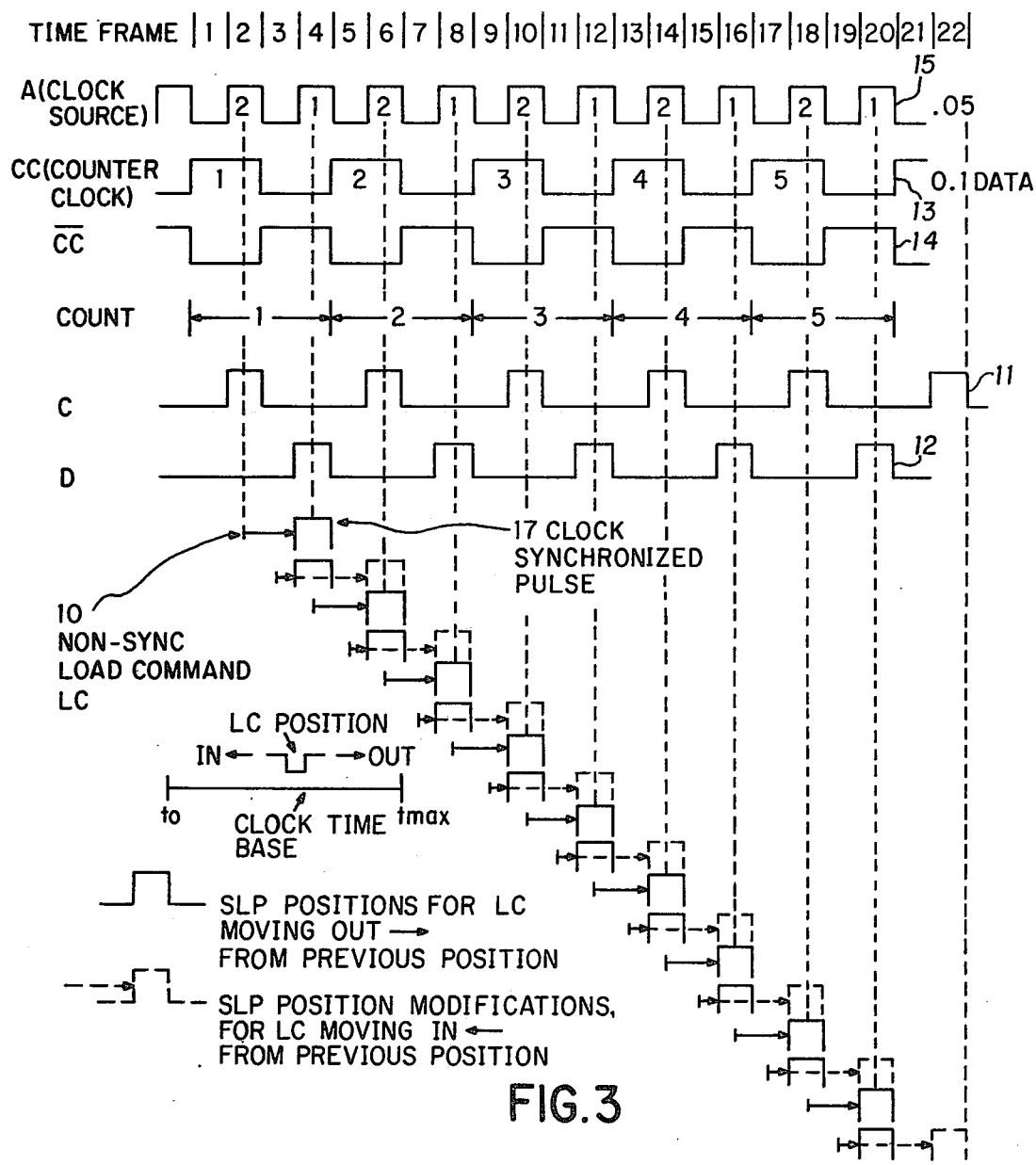
FIG. 3 is a functional operational diagram of the hysteresis circuit of FIG. 1, illustrating the time position of synchronous load command output pulses in response to exampled time positions of asynchronous input load command pulses.

FIG. 2 illustrates logic circuitry by means of which a source of clock pulses 15 from a clock soource 33 is utilized to develop the operational waveforms, A, CC, $\overline{CC}$, C and D. In the embodiment of FIG. 1, the clock pulse 15 comprises the operational waveform A, and is divided by two in dividing means 34 to generate the counter pulse train 13. The counter clock pulse train 13 might, for example, define a DME system resolution of 0.1 nautical mile, in which case the clock source A would correspond to 0.05 nautical mile resolution. In FIG. 2, the counter clock pulse train 13 may be applied through inverter 35 to develop the counter clock complement ($\overline{CC}$) operational waveform 14. The ANDing of counter clock pulse train 13 with the clock source pulses 15 in AND gate 36 develops the C operational waveform 11, while the ANDing of the counter clock complement pulse train 14 with the clock source 15 by AND gate 37 produces the D operational waveform. 12. Reference is made to FIG. 3, wherein the A pulses (the clock source pulses) are depicted in timing relationship with the counter clock pulse train, the counter clock complement pulse train, and the C and D operational pulses.

Now, with reference again to FIG. 1, the nonsynchronous input load command pulse 10 is applied to the clock input of a first J-K flip-flop 18. The C and D operational waveforms are applied as respective inputs to the J and K terminals of flip-flop 18. The Q output 19, together with the A operational pulse train 15 and counter clock complement pulse train 14, are applied as respective inputs to a first AND gate 21. The $\overline{Q}$ output 20 from flip-flop 18, together with the A operational pulse train 15 and counter clock pulses 13 are applied as respective inputs to a further AND gate 22. The respective outputs 23 and 24 from AND gates 21 and 22 are applied to an OR gate 25, with the output 26 from OR gate 25 comprising a first input to a further AND gate 29. The input load command pulse 10 is applied as a reset input to a further J-K flip-flop 27, as well as a further input to AND gate 29. The $\overline{Q}$ output 28 from flip-flop 27 is applied as a third input to AND gate 29 and also as an input in common to both the J and K input terminals of flip-flop 27. The output from AND gate 29 is applied to the clock input of J-K flip-flop 17. Output 27 from AND gate 29, as will be further described, comprises a gated one of either the C or D operational pulses. The output pulse 17 is time synchronized with respect to a predetermined portion of a system clock cycle and might be applied to a differentiating network 30 the output of which is applied in common as respective inputs to a further AND gate 31 to develop a synchronized load pulse 32 corresponding to the leading edge of the synchronous output pulse 17.

Operation of the hysteresis circuitry of FIG. 1, under control of the operational pulse trains supplied by he circuitry of FIG. 2, may be defined by consideration of the response of the circuitry of FIG. 1 to a load command input pulse 10 falling in one of three operational mode defining time positions with respect to the operatioanl waveforms C and D. Operation will be described with the nonsynchronous load command input pulse 10 being time coincident with a C pulse, being coincident with neither of the C nor D pulses, and being time coincident with a D pulse.

With reference to FIG. 3, note that the C operational pulses occupy like positions with respect to successive ones of the counter clock pulses 13. As depicted, the C pulses correspond in time duration to the second quarter-cycle of successive cycles of the clock pulse train 13. The D pulses occupy like positions in successive second half-cycles of the counter clock pulse train 13 (occupy the last quarter of successive clock pulse cycles).

Operation of the circuitry of FIG. 1 will be described with reference to the operational waveforms of FIG. 3 and FIG. 8, with FIG. 3 illustrating successive time frames for illustration purposes.

Figure 8:
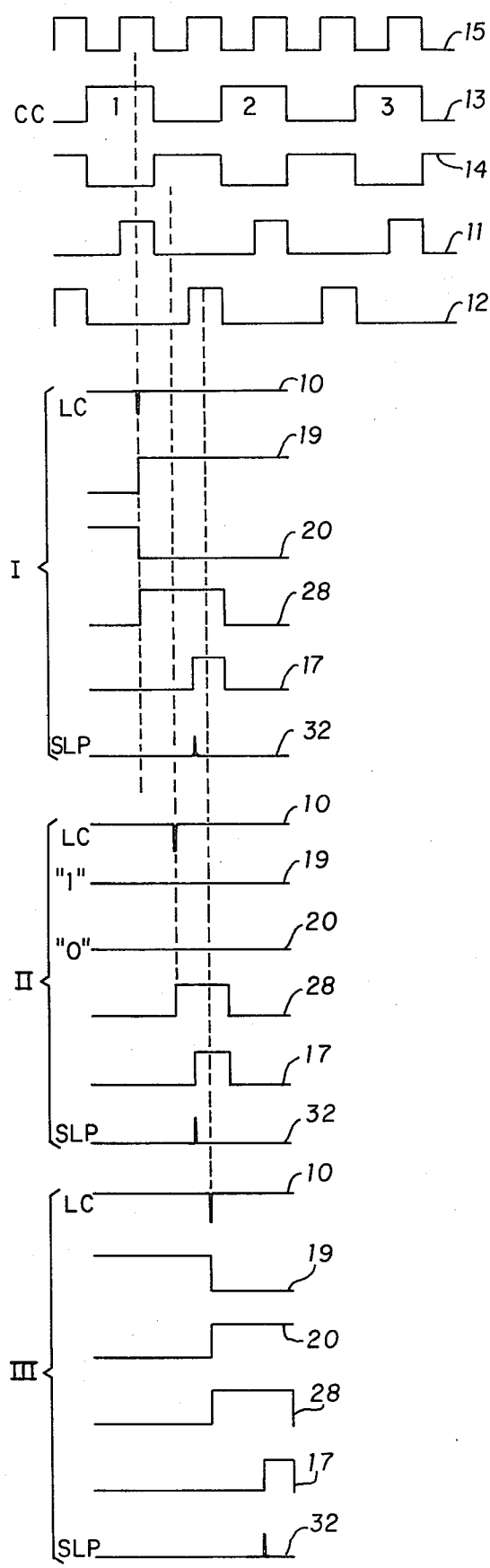
FIG. 8 depicts operational waveforms relating to the operation of the embodiment of FIG. 1.

Considering first the operation of the circuitry of FIG. 1 when the load command pulse is slewing out on the clock time base with a load command input pulse 10 occurring in time frame two, and thus time coincident with a C pulse 11, the operation of the circuitry is depicted by the waveforms I of FIG. 8. Load command pulse 10 is applied to the clock input of J-K flip-flop 18. The J and K inputs are respectively logic "one" and logic "zero", as defined by respective operational waveforms C and D. Flip-flop 18, at the time occurrence of load command pulse 10, is thus clocked for a Q output 19 of the logic "one". The $\overline{Q}$ output 20 of flip-flop 18 is thus logic "zero". The logic "one" Q output 19 of flip-flop 18, together with an existing A pulse logic "one" and a $\overline{CC}$ logic "one" existing at this moment, gates an A pulse through AND gate 21 and OR gate 25 onto the output 26 of OR gate 25 during time frame four. Since at the time occurrence of the load command pulse 10, J-K flip-flop 27 was reset for a $\overline{Q}$ output 28 of logic "one", only this single A pulse is allowed to pass through AND gate 29 in time frame four as a clock synchronous pulse 17. The leading edge of this clock synchronous pulse 17, as depicted by a synchronized load pulse output 32, is seen to occury midway in the second half of a counter clock pulse cycle, though the load command pulse 10 in response to which it was generated occurred within the first half of this counter clock pulse cycle. A clock synchronized time delay was thus introduced between the input 10 and output 32.

Now, if the load command input pulse 10 were assumed to next occur in time frame three, the operational waveforms II of FIG. 8 illustrate the generation of the synchronized load pulse output. With the load command pulse 10 occuring in time frame three, both the C and D waveforms exhibit a logic "zero", and the application of the load command pulse 10 to the clock input of J-K flip-flop 18 occurs at a time when both the J and K inputs thereof are logic "zero". Thus, flip-flop 18 does not change state. As depicted in waveforms II of FIG. 8, the Q output 19 continues to exhibit a logic "one", while the $\overline{Q}$ output 20 continues to exhibit a logic "zero". As a result, a logic "one" A pulse of waveform 15 is again gated through AND gate 29 in time frame four.

It might be noted, in either of the above depicted situations, that a synchronized load pulse is developed at a discrete later period in time with respect to the input load command pulse 10.

Further analysis of outbound slewing is depicted in waveforms III of FIG. 8, wherein the load command pulse 10 next occurs in time frame four and is thus synchronous with a D operatioanl pulse 12. The load command pulse 10 then occurs at a time when the K input of flip-flop 18 is logic "one" and the J input a logic "zero", causing the Q output 19 of flip-flop 18 to be a logic "zero" and the $\overline{Q}$ output thereof a logic "one". Flip-flop 27 is again reset by load command pulse 10 such that the $\overline{Q}$ output 29 thereof exhibits a logic "one", and an A pulse 15, occurring in the frame six, is ANDed through AND gate 29 as the clock synchronous pulse 17 which develops synchronized load pulse 32 in time synchronism with the leading edge of pulse 17. The time occurrence of a load command pulse time coincident with a D pulse 12 thus causes the synchronized load pulse 32 to be developed at a discrete later period of time corresponding to the leading edge of the next occurring one of the C pulses 11.

The discrete operational modes of the circuitry of FIG. 1, depicted in waveform groups I, II and III of FIG. 8, define the three governing operational modes of the hysteresis circuitry and FIG. 3 depicts (in solid line) the time position of clock synchronized pulses 17 (the leading edges of which define the time position of the synchronized load pulse output 32) in response to load command pulses 10 appearing in successive outbound time frames. With reference to FIG. 3, it is noted that the clock synchronized pulse which appears at output 17 is time synchronous with one of the clock source pulses 15 in each situation, and that alternate ones thereof are gated to the output as the load command input moves outbound through successive time frames. In general, it may be seen that the operational waveforms C correspond to alternate ones of the clock source pulses 15 while operational waveform pulses D correspond to the intermediate alternate ones of the clock source pulses 15. Pulses C are seen to be time coincident with the second quarter of successive cycles of counter clock pulses 13, while operational waveform pulses D are time synchronous with the last quarter of successive cycles of counterclock pulses 13.

It might be further noted that, with outbound load command slewing, a load command pulse input 10 occurring between the leading edge of any C pulse and the next occurring D pulse develops a synchronized load pulse 32 defined by that D pulse, while a load command pulse 10 occurring in time between the leading edge of any D pulse and the next time occurring one of the C pulses develops a synchronized load pulse defined by that C pulse.

Operation of the circuitry of FIG. 1 has been described with respect to monotonic outbound slewing, as concerns the load command input pulses and the clock time base. Considering now the case of inboard monotonic slewing, where the load command pulse consistently appears at a lesser time position on the clock defined time base in successive appearances thereof, FIG. 3 illustrates (in dashed configuration) modifications to the time positions of synchronized load pulse outputs when the load command input moves in on the clock time base. With reference to FIG. 3, it is noted that load command input pulses falling during the time occurrence of C and D operational pulses provide the same synchronized load pulse output time positions as with outboard slewing. However, a distinct difference is noted between the time position of synchronized load output pulses which are generated in response to load command inputs which are not time synchronous with either of the C and D operational pulses. With inboard slewing, considering the synchronized load pulse time positions with depicted phantom line modifications, load command input pulses whose time positions lie between C and D pulses generate synchronized load command pulses which are imparted with an additional time delay amounting to one-half a counter clock cycle. This additional delay is dictated by the logic circuitry of FIG. 1 when considering that the particular one of the C and D pulses gated through to define the synchronized load output pulse is operatioanlly defined by the existing state of J-K flip-flops of FIG. 1 at the time occurrence of the load command pulse together with the flip-flop J and K input levels at the time occurrence of the load command pulse. Although not specifically illustrated in the drawings, the inboard slewing time positions, as concerns synchronized load output pulses, may be shown to be that depicted in FIG. 3, when considering the phantom line position modifications.

The significance of this hysteresis feature becomes apparent when considering that a load command input pulse, normally slewing in a given direction (either in or out on the clock defined time base) which backs up from the direction in which it was moving (as might be caused by a time jitter on the load command position due to system uncertainty) will, due to the unique hysteresis of the circuitry, cause the synchronized load output pulse to still occur at the previous time position throughout a defined time window. This window is defined as one-fourth a counter clock period in the FIG. 1 embodiment, that is, the time separation between successive C and D operational pulses.

With reference to FIG. 3, the above-defined hysteresis may be exampled as follows. Considering a load command input pulse 10 to be slewing in an outbound manner with respect to the clock defined time base and a load command pulse occurring in time frame two, synchronized load command pulse is generated in time frame four. A next subsequent load command pulse occurring in time frame three again generates a synchronized load command pulse in time frame four. A next load command pulse during time frame four generates a synchronized load command pulse during time frame six. Considering the next load command pulse to occur during time frame five, a synchronized load command pulse is again generated in time frame six.

Now, should a next subsequent load command pulse back up to time frame four (the inbound slewing logic now applying) the synchronized load command pulse remains in time frame six. Should the load command pulse back up to time frame three, the synchronized load command pulse (now defined by the phantom indication) still remains in six. Thus the hysteresis effect causes the synchronized load command pulse, in the presence of jitter as to the time position of successive load command input pulses, to remain at a position sufficiently time delayed that the clock count remains at the most outbound value. That is, the count which might be read out to an indicator means at the time of the synchronized load command output does not back up in the presence of jitter or dance on the load command input pulses as they are slewing in one direction or the other.

In general, the load command input pulse can back up from the direction it was going by time intervals defined by the time separation between the operational C and D pulses. The time between C and D pulses defines a dead zone where the synchronized load output pulse position is caused to be generated where it was previously generated. The time between C and D pulses which defines this dead zone is that from the leading edge of a C pulse to the next time-subsequent D pulse when considering outbound slewing, and from the trailing edge of one of these pulses to the trailing edge of next time occurring one of these pulses when considering inboard slewing. FIG. 3 thus illustrates that two distinctly different time positions are possible for output pulses generated from input commands falling between C and D pulses, depending upon whether the time position of the load command pulse is definitive of inbound slewing or outbound slewing.

If then one considers the load command pulses moving at a slow rate from the clock time base, and on top of this slow rate is a high frequency noise of jitter (load command pulse dancing back and forth as it moves generally in a given direction), the embodiment of FIG. 1 tolerates such a dance of up to one-fourth counter clock period without causing jitter in a clock output indication which is updated by successive synchronized load output pulses. In general, the amount of protection the circuitry affords is defined by the time separation between the operatioanl pulses C and D. The narrower the C and D pulses are caused to be, the greater the band of protection. From a general design standpoint there is, therefore, a tradeoff between the amount of protection you can possibly get, versus the situation where the protection may be missed altogether; that is, the C and D operational pulses might be made narrower and narrower to increase protection up to one-half a counter clock period as a theoretical maximum. This theoretical maximum is unattainable since it would define infinitely narrow C and D operational pulses.

Figure 5:
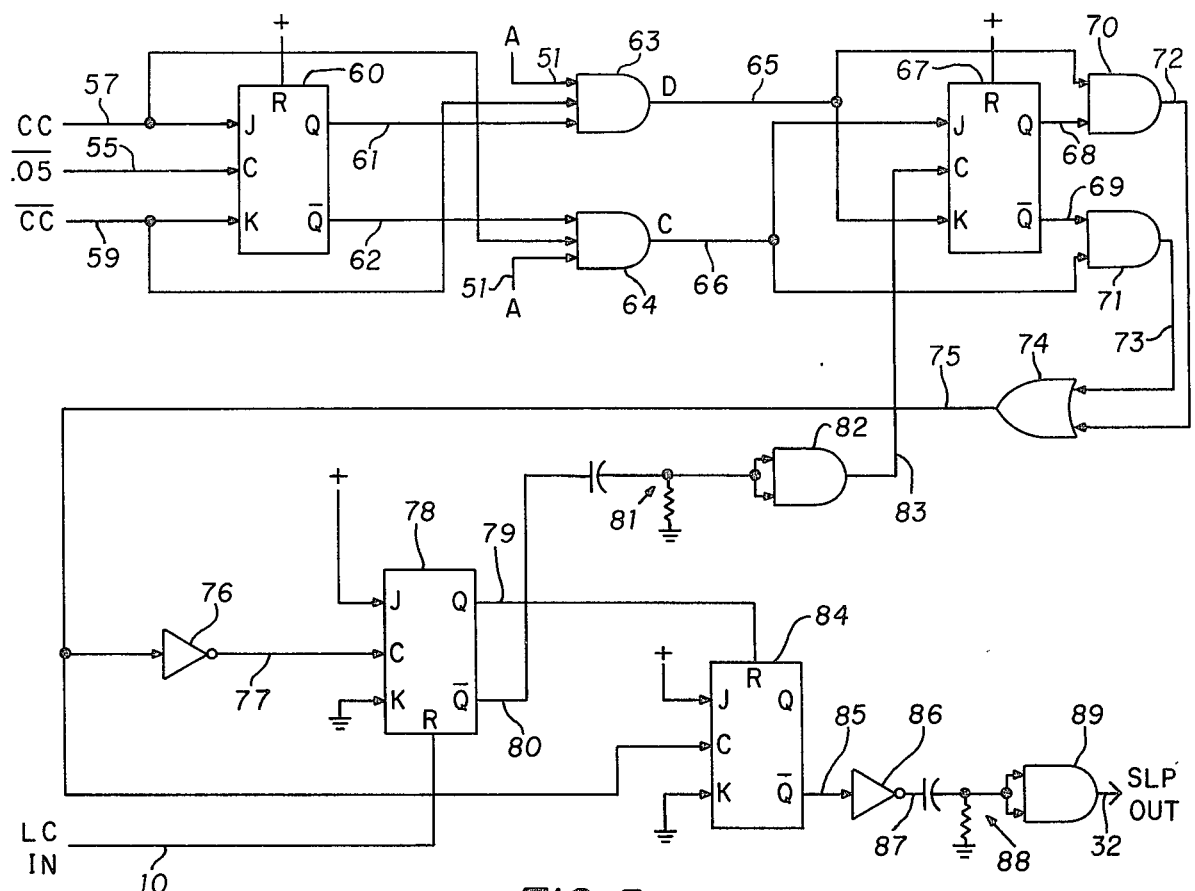
FIG. 5 is a functional diagram of a further embodiment of a digital hysteresis circuitry in accordance with the present invention.

An improved and alternate hysteresis circuitry is depicted in FIG. 5 wherein the C and D pulses, which are selectively gated to define the time position of the synchronized load pulse output, are comprised of clock synchronous pulses each of which is one-eighth of a counter clock cycle in duration with the terminal edges thereof being time coincident with the center of successive half cycles of the counter clock pulse train.

As in the previously described embodiment, synchronized load pulses are developed at a time established by either the C or D operational waveforms and are generated at times corresponding to the midpoint of successive half-cycles of the counter clock pulse train. The C and D operational pulses again appear at like clock-synchronous time positions in alternate half-cycles of the counter clock pulse train. Since, however, the transition times, as concerns the C and D pulses, are more widely separated from the transition times of the counter clock pulse train, a greater degree of protection is afforded.

With reference to FIGS. 5 and 6, and again assuming a system with 0.1 resolution, a clock source 50 may provide an output pulse train 51 as the source of A gating pulses. The clock output 51 may be divided in a divider 52 to provide an output 53 corresponding to 0.05 resolution which may be inverted in inverter 54 to provide a $\overline{.05}$ waveform 55. The waveform 53 may be further divided in divider 56 to produce a counter clock (CC) pulse train 57 which corresponds to the system resolution of 0.1, while an inversion through inverter 58 provides a counter clock complement pulse train ($\overline{CC}$) 59.

Figure 6:
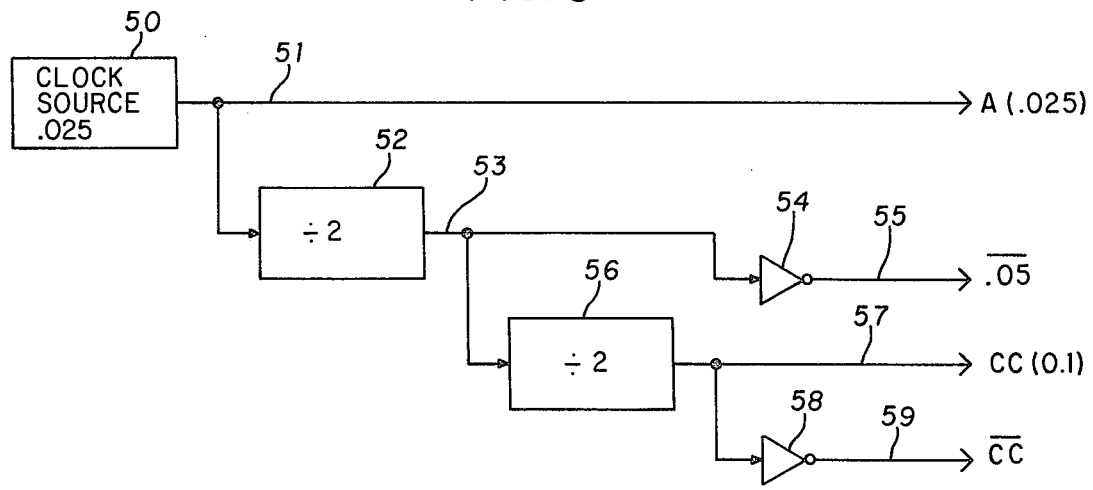
FIG. 6 is a functional diagram of logic circuitry by means of which control waveforms for the system of FIG. 5 might be generated.

The logic circuitry of FIG. 5, in response to the pulse train outputs provided from the logic circuitry of FIG. 6, may be utilized to develop, in response to a load command input pulse 10 (asynchronous with respect to the system clock) a synchronized load pulse output 32 which is time synchronous with the clock and caused to occur always at a quarter-cycle point from a counter clock transition. With reference to FIG. 5, counter clock pulse train 57 and counter clock complement pulse train 59, along with the $\overline{.05}$ pulse train 55, are applied to a J-K flip-flop 60. The counter clock 57 is applied to the J input of flip-flop 60 while the complement thereof is applied to the K input. The $\overline{.05}$ input 55 is applied to the clock input of flip-flop 60. The Q output 61 of flip-flop 60 is applied along with A pulses 51 and counter clock complement pulses 59 as respective inputs to an AND gate 63 to develop the D pulses depicted in FIG. 7. The $\overline{Q}$ output 62 of flip-flop 60 is applied along with the counter clock input 57 and A pulses 51 as respective inputs to a further AND gate 64 to develop the C pulses 66 illustrated in FIG. 7.

The output 65 from AND gate 63 (pulses D) is applied to the K input of a further J-K flip-flop 67 and as the first input to an AND gate 70. The Q output 68 from flip-flop 67 comprises a second input to AND gate 70. The output 66 from AND gate 64 (pulses C) is applied to the J input of flip-flop 67 and as a first input to an AND gate 71. The $\overline{Q}$ output 69 from flip-flop 67 comprises a second input to AND gate 71. The outputs 72 and 73 from AND gates 70 and 71 are applied as respective inputs to an OR gate 74. The output 75 from OR gate 74 is applied directly to the clock input of a further J-K flip-flop 84, and through an inverter 76 as a clock input 77 to a J-K flip-flip 78. The Q output 79 from J-K flip-flop 78 is applied to the reset input of flip-flop 84 and the load command input pulse 10 is applied to the reset input of J-K flip-flop 78. The $\overline{Q}$ output 80 from flip-flop 78 is differentiated by means 81. The differentiated $\overline{Q}$ output from flip-flop 78 is applied in common as repective inputs to an AND gate 82 the output 83 of which is applied as clock input to flip-flip 67. The $\overline{Q}$ output 85 from flip-flop 84 is applied through inverter 86, differentiating network 87, and AND gate 89 to deveelop the synchronized load pulse output 32.

Figure 9:
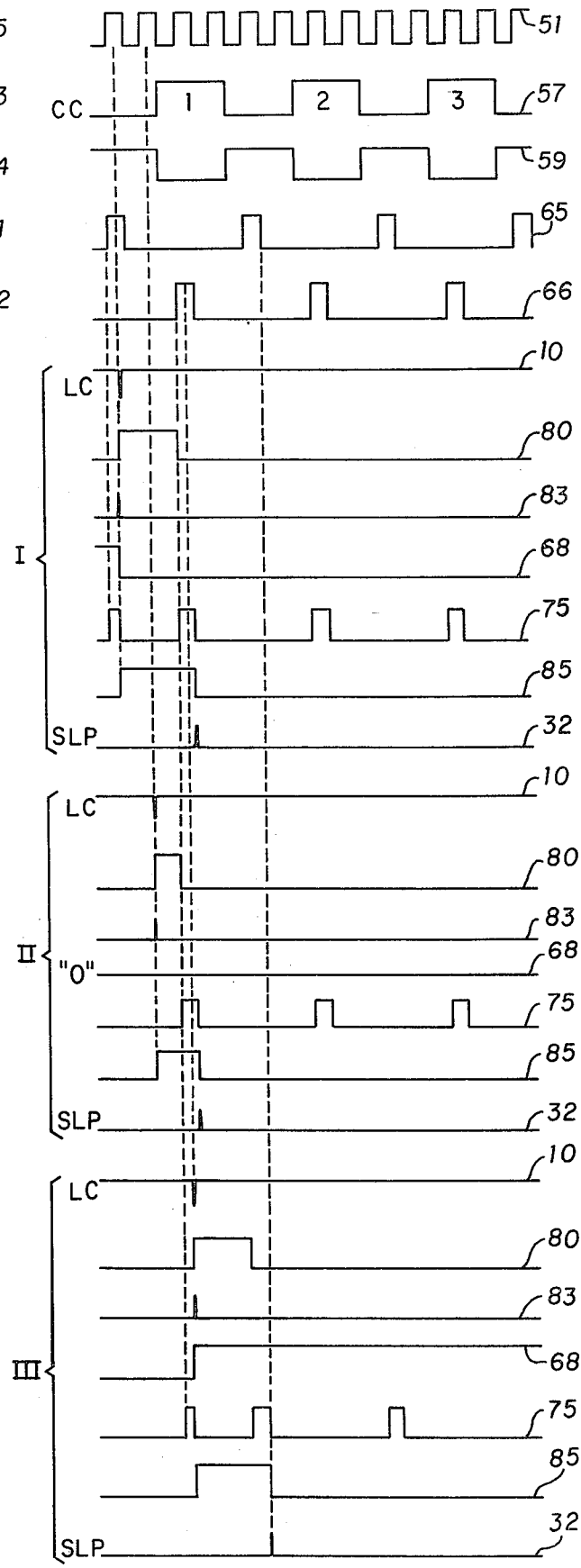
FIG. 9 depicts operational waveforms related to the embodiment of FIG. 5.

Operational wave forms depicting the development of synchronized load outputs 32 in response to successive load command inputs 10 slewing outwardly and occurring in three discrete time postions as concerns the C and D operational pulses 65 and 66, are shown in FIG. 9. Waveforms I depict operation for the time occurrence of a load command pulse 10 as it slews outwardly to be time coincident with a D pulse 65. Operational waveforms II depict operation when the load command pulse 10 further slews outwardly and is not coincident with either of the C or D pulses 66 and 65. Operational waveforms III depict operation of the circuitry when the load command pulse 10 slews further outwardly to be time coincident with a C pulse 66.

Figure 7:
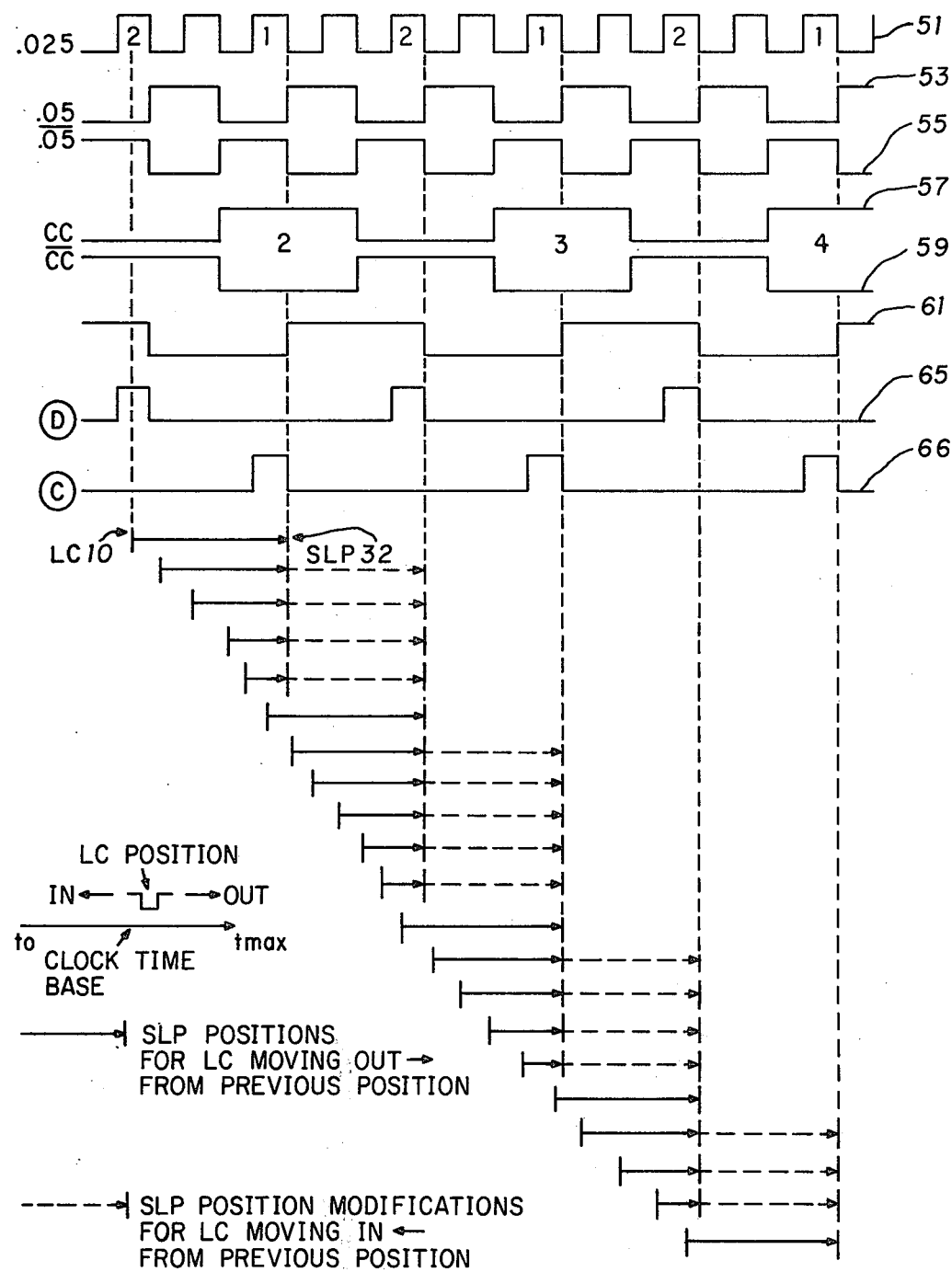
FIG. 7 is a functional diagram of operational waveforms depicting the time position of output synchronied load pulses generated by the system of FIG. 5 in response to exampled time positions of asynchronous input load command pulses.

With reference to FIG. 7, it is noted that any outward slewing load command pulse 10 appearing between the leading edge of a D pulse 65 and the next time-succeeding one of the C pulses 66 causes a synchronized load pulse 32 to appear at the trailing edge of that next time-succeeding C pulse 66. Any load command pulse 10 occurring between the leading edge of a C pulse 66 and the leading edge of the next time-succeeding one of the D pulses 65 causes a synchronized load pulse to be developed which is time synchronous with the trailing edge of that next time-succeeding D pulse. Thus, the synchronized load pulses, as in the previously described embodiment, are always caused to occur at the midpoint of second half-cycles of the counter clock 57 and can never be time synchronous with the clock transition point.

The hysteresis feature is again apparent from consideration of the time positions of synchronized load output pulses 32 for inbound slewing, as depicted in FIG. 7. FIG. 7 illustrates (in phantom line) modifications to the time positions of synchronized load pulse outputs when the load command input moves inbound on the clock time base. For inbound slewing, load command input pulses falling within C or D operational pulses again cause synchronized load pulses to occur as defined by the time position of the next time-subsequent one of these operational pulses. Again, as described with respect to the previous embodiment, those load command pulses (during inbound slewing) which occur between operational pulses C and D (not time coincident with either of these pulses) generate output pulses which are imparted with an additional time delay of one-half counter clock cycle. The logic circuitry of the embodiment of FIG. 5 dictates the time positions as illustrated in FIG. 7 for synchronized load pulses in response to successive load command pulses during inbound slewing. Since the C and D pulses are one-eighth of a counter clock pulse cycle in duration, the time periods during which a load command pulse falls in the dead zone between C and D pulses (that is, is not time coincident with either a C or D pulse) is increased to three-eights of a clock period, and jitter on successive input load command pulses up to three-eighths of a counter clock period is tolerated before this jitter would appear in a clock count indication updated in response to successive synchronized load command output pulses. The increased protection utilizing these narrower operational pulses C and D is pictorially indicated in FIG. 7, where again the time position of synchronized load pulses 32 is logically defined by consideration of whether a current load command input pulse 10 does or does not represent a backing up from the direction from which it previously moved on the clock defined time base.

Figure 4:
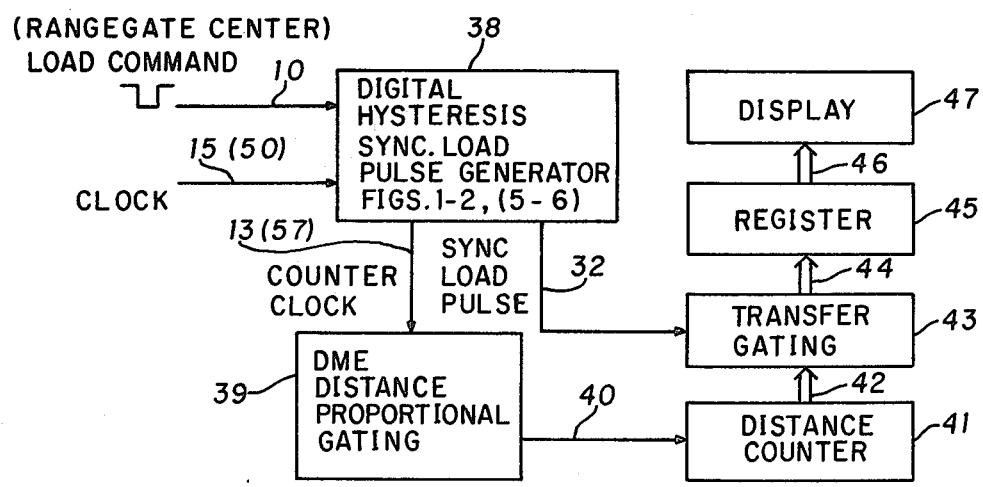
FIG. 4 is a functional diagram of a DME system, illustrating utilization of the synchronized load pulse generation means of the present invention to transfer an accumulated count into output utilization means.

Either of the above-described embodiments may be utilized in developing synchronized load pulses for transferring, upon command, the count in a counter to an output register for display or other utilization purposes. FIG. 4 illustrates the application as it might apply to a DME system wherein the synchronized load command pulses 10 (which may in a system comprise a range gate center pulse) along with clock pulses 15 (50) may be applied to a digital hysteresis pulse generator 38 (as embodied in FIGS. 1–2 and FIGS. 5–6). The counter clock pulses 13 (57) developed by the digital hysteresis synchronized load pulse generator 38 may be applied to DME distance proportional gating circuitry 39 which conventionally functions to gate a number of counter clock pulses on line 40 to a distance counter 41. The count accumulated in distance counter 41 corresponds to the distance measurement. The binary count in the counter 41 may be applied on parallel lines 42 as input to a transfer gating means 43 which, under the control of the synchronized load pulse 32 developed by the hysteresis synchronized load pulse generator 38, transfers the count in the counter on lines 44 to an output register 45. Register 45 may apply the count on lines 46 to a display means 47 or other utilization means. In accordance with the present invention the synchronized load pulse 32 will never occur at any count transition time as concerns the distance counter and thus jitter otherwise attributed to this situation is obviated. Synchronized load pulse 32, in being developed at a discrete later period in time than the time occurrence of the asynchronous load command input 10, as above described, tends to prevent the count as displayed on display means 47 from "backing up" due to system uncertainty as to the position of successive ones of the load comand input pulses 10.

In accordance with the above-described embodiments, it is preferable that the transition times of the C and D operational pulses, which in turn define the time position of the synchronized load pulse, not occur near the transition time of the counter clock for maximum effectiveness. Thus the embodiment of FIG. 5 also includes the development of operational control pulses C and D, the time durations of which occur near the center of successive half-cycles of the counter clock pulses. Development of the narrower C and D pulses of the embodiment of FIG. 5 resulted from developing a counter clock pulse train which represented a further subdividion of the system clock per se. It is contemplated that appropriate logic circuitry might be utilized in accordance with the teaching of the present invention to define the system counter clock pulse train as an integral division of any even higher system clock repetition rate and to develop C and D pulses of successively narrower duration so as to even further remove uncertainties caused by load command pulses being synchronous with the transition times of the operational pulses C and D.

Thus, although the present invention has been described with respect to particular embodiments thereof, it is not to be so limited as changes might be made therein which fall within the scope of the present invention as defined by the appended claims.

What is claimed is:

1. Pulse generating means comprising a clock pulse train, a source of load command pulses asynchronous with said clock pulse train, a waveform generator receiving said clock pulse train as input thereto, said waveform generator comprising means to generate first and second gating pulse trains, said first gating pulse train comprising pulses time coincident with a predetermined portion of successive first half-cycles of said clock pulse train, said second gating pulse train comprising pulses time coincident with like predetermined portions of successive second half-cycles of said clock pulse train, and logic gating means receiving said first and second gating pulse trains and said load command pulses as inputs thereto and developing an output pulse the time occurrence of which is defined by the time occurrence of a predetermined one of said first and second gating pulse train pulses generated subsequent to the time occurrence of said load command pulse.

2. The pulse generating means of claim 1 wherein said load command pulses are slewed in a predetermined direction along a clock pulse train defined time base and said predetermined one of said first and second gating pulse train pulses comprises the next time-subsequent one of said first and second gating pulse train pulses in response to said load command pulses slewing outbound on said clock defined time base, and comprises the second one of the time-subsequent ones of said first and second gating pulse train pulses in response to said load command pulses slewing inbound on said clock pulse train defined time base.

3. The pulse generating means of claim 2 wherein said first and second gating pulse trains are defined as respective different selected time repetitive pulses of a pulse train defined as an even integer multiple of said clock pulse train.

4. The pulse generating means of claim 3 wherein said first and second gating pulse train pulses have a time duration not exceeding that defined by one quarter-cycle of said clock pulse train pulses.

5. The pulse generating means of claim 4 wherein said first gating pulse train pulses are time coincident with the second quarter-cycle portions of respective clock pulse train cycles and said second gating pulse train pulses are time coincident with the last quarter-cycle portions of respective clock pulse train cycles.

6. The pulse generating means of claim 4 wherein said first pulse gating train pulses are time coincident with the second eighth-cycle portions of respective clock pulse train cycles and said second gating pulse train pulses are time coincident with the sixth eighth-cycle portions of respective clock pulse train cycles.

7. The pulse generating means of claim 4 wherein one of the leading and trailing edges of successive ones of said first and second gating pulse train pulses is time coincident with the midpoint of successive half-cycles of said clock pulse train cycles.

8. The pulse generating means of claim 7 comprising a further pulse generator receiving said output pulses as input thereto and responsive to said output pulses, to generate a synchronous load pulse output corresponding in time to one of said clock pulse train one-quarter and three-quarter cycle positions.

* * * * *

UNITED STATES PATENT OFFICE
CERTIFICATE OF CORRECTION

PATENT NO. : 3,959,730
DATED : May 25, 1976
INVENTOR(S) : Charles A. Weber and Michael W. Lundgreen It is certified that error appears in the above-identified patent and that said Letters Patent are hereby corrected as shown below:

Column 1, Line 66, delete "peeriod" and substitute therefor --period--.
Column 2, Line 4, delete "91.1" and substitute therefor --97.1--.
Column 3, Line 35, after "counter" (first occurrence), add --clock--.
Column 4, Line 16, after the word "by" delete "he" and substitute therefor --the--.
Column 5, Line 29, after "output" delete "29" and substitute --28--.
Column 6, Line 32, delete "operatioanlly" and substitute therefor --operationally--.
Column 7, Line 46, delete "operatioanl" and substitute therefor --operational--.
Column 9, Line 54, delete "three-eights" and substitute therefor --three-eighths--.
Column 10, Line 34, delete "above-descriped" and substitute therefor --above-described--.

Signed and Sealed this

Third Day of August 1976

[SEAL]

Attest:

RUTH C. MASON
*Attesting Officer*

C. MARSHALL DANN
*Commissioner of Patents and Trademarks*